(12) United States Patent
Pan

(10) Patent No.: US 6,200,905 B1
(45) Date of Patent: Mar. 13, 2001

(54) METHOD TO FORM SIDEWALL POLYSILICON CAPACITORS

(75) Inventor: Yang Pan, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/531,785

(22) Filed: Mar. 21, 2000

(51) Int. Cl.⁷ .................................................. H01L 21/302
(52) U.S. Cl. ............................................ 438/706; 438/720
(58) Field of Search ..................................... 438/706, 720

(56) References Cited

U.S. PATENT DOCUMENTS

| | | | |
|---|---|---|---|
| 5,498,889 | 3/1996 | Hayden | 257/301 |
| 5,701,647 | 12/1997 | Saenger et al. | 29/25.42 |
| 5,760,435 | 6/1998 | Pan | 257/314 |
| 5,912,492 | 6/1999 | Chang et al. | 257/344 |

*Primary Examiner*—Benjamin L. Utech
*Assistant Examiner*—Lynette T. Umez-Eronini
(74) *Attorney, Agent, or Firm*—George O. Saile; Rosemary L. S. Pike; Douglas R. Schnabel

(57) ABSTRACT

A new method of forming sidewall capacitors in the manufacture of an integrated circuit device has been achieved. Conductive traces are formed overlying a semi-conductor substrate. A portion of the conductive traces, which may comprise polysilicon, forms the bottom plates for planned sidewall capacitors while a portion forms MOS transistor gates. A dielectric layer is deposited overlying the conductive traces. A conductive layer is deposited overlying the dielectric layer. The conductive layer is etched down to form conductive sidewall spacers on the dielectric layer of the MOS transistor gates and to form top plates for the sidewall capacitors. The conductive sidewall spacers of the MOS transistor gates are etched away while the top plates of the sidewall capacitors are protected with a protective mask. The dielectric layer is etched down to form dielectric sidewall spacers on the MOS transistor gates while the sidewall capacitors are protected with a protective mask.

20 Claims, 5 Drawing Sheets

US 6,200,905 B1

METHOD TO FORM SIDEWALL POLYSILICON CAPACITORS

BACKGROUND OF THE INVENTION (1) Field of the Invention

The invention relates to a method of fabricating semiconductor structures, and more particularly, to a method of forming polysilicon sidewall capacitors in the manufacture of an integrated circuit device.

(2) Description of the Prior Art

Capacitors are an important enabling component for integrated circuit manufacture. High unit capacitance structures are needed in the formation of memory cells such as SRAMs and DRAMs. Polysilicon-to-polysilicon parallel plate capacitors are a favored approach because neither plate comprises a substrate junction. Therefore, junction leakage and parasitic device concerns are avoided. Unfortunately, parallel plate structures often have a relatively low per unit area capacitance and therefore require large areas to form large capacitors.

Several prior art approaches concern the formation of sidewall capacitors and related structures. U.S. Pat. No. 5,498,889 to Hayden discloses a method to form sidewall capacitors on the sidewalls of via openings over MOS gates. A stack of dielectric-metal-dielectric is deposited over the MOS gate. A via opening is created over the gate through the stack. A metal sidewall spacer is formed in the via opening. A capacitor dielectric is then deposited. A second metal spacer is formed over the capacitor dielectric. The capacitor dielectric is etched through to expose the gate electrode. A metal layer is deposited to complete connectivity and the capacitor. U.S. Pat. No. 5,912,492 to Chang et al teaches a process to reduce hot carrier effects in a short channel MOSFET. After gate definition and lightly-doped drain (LDD) implantation, conductive sidewall spacers are formed on the gate. The conductive spacers overlie the gate oxide and the LDD and, thereby reduce the electric field and the hot carrier effect. U.S. Pat. No. 5,701,647 to Saenger et al discloses a method to form capacitors that eliminates contact between high dielectric constant material and silicon. Sidewall capacitors are formed by first patterning a stack of dielectric and conductive layers. Another conductive layer is then deposited. This conductive layer is anisotropically etched to form sidewalls. A capacitor dielectric layer is then deposited and etched down to overlie the conductive sidewalls. A metal layer is deposited to fill the trenches and to form the top plate for the capacitor. U.S. Pat. No. 5,760,435 to Pan teaches a method to form EEPROM cells with double floating gates. Conductive sidewalls are formed overlying tunnel oxide in the cell fabrication.

SUMMARY OF THE INVENTION

A principal object of the present invention is to provide an effective and very manufacturable method to form sidewall capacitors in the manufacture of integrated circuits.

A further object of the present invention is to provide a method to form sidewall capacitors with polysilicon plates.

Another further object of the present invention is to provide a method to form polysilicon sidewall capacitors in a process concurrent to the formation of MOS transistor gates.

In accordance with the objects of this invention, a new method of forming sidewall capacitors in the manufacture of an integrated circuit device has been achieved. Conductive lines are formed overlying a semiconductor substrate. A portion of the conductive lines, which may comprise polysilicon, forms the bottom plates for planned sidewall capacitors while a portion forms MOS transistor gates. A dielectric layer is deposited overlying the conductive lines. A conductive layer is deposited overlying the dielectric layer. The conductive layer is etched down to form conductive sidewall spacers on the dielectric layer of the MOS transistor gates and to form top plates for the sidewall capacitors. The conductive sidewall spacers of the MOS transistor gates are etched away while the top plates of the sidewall capacitors are protected with a protective mask. The dielectric layer is etched down to form dielectric sidewall spacers on the MOS transistor gates while the sidewall capacitors are protected with a protective mask.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of sidewall capacitors in the manufacture of integrated circuit devices. It should be clear to those experienced in the art that the present invention can be applied and extended without deviating from the scope of the present invention.

Figure 1:
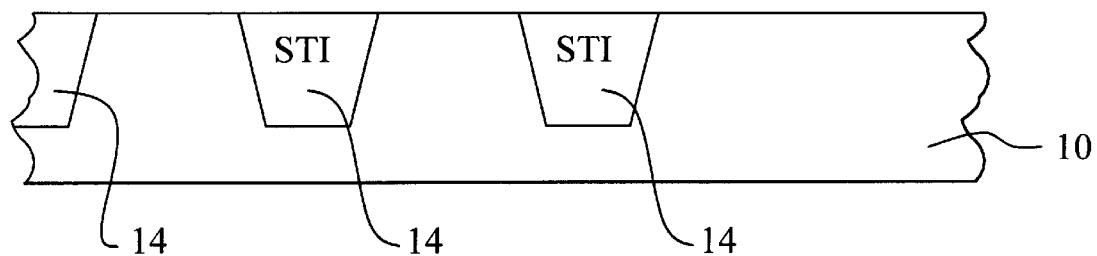
FIGS. 1 through 8 schematically illustrate in cross-sectional representation the preferred embodiment of the present invention.

Referring now particularly to FIG. 1, there is shown a cross-sectional representation of the preferred embodiment of the present invention. A semiconductor substrate 10 is provided. The semiconductor substrate 10 preferably comprises monocrystalline silicon. Shallow trench isolation (STI) regions 14 are formed in the semiconductor substrate 10 to separate active areas. The STI 14 may be formed using a trench etch, oxide fill, and polish down sequence as conventional in the art.

Figure 2:
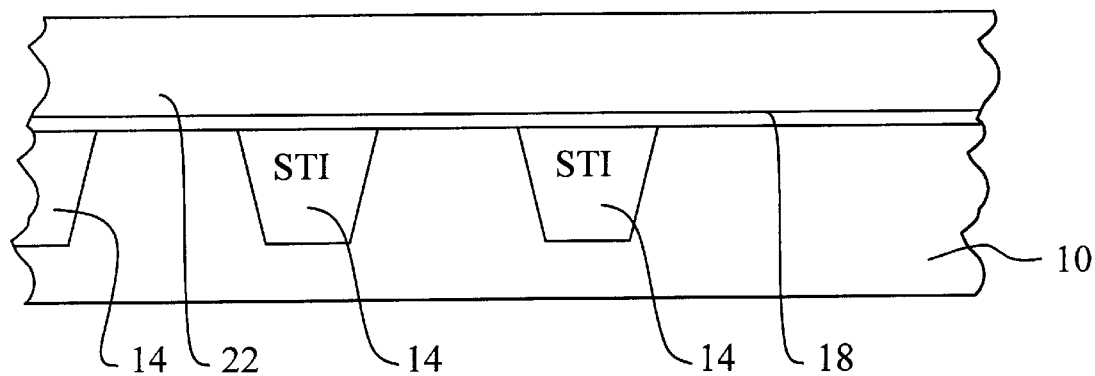

Referring now to FIG. 2, a gate oxide layer 18 is formed overlying the semiconductor substrate 10. The purpose of the gate oxide layer 18 is to form the dielectric for the subsequently formed MOS transistor gates. The gate oxide layer 18 may be formed using either a thermal oxidation process or a chemical vapor deposition (CVD) process. The gate oxide layer 18 is preferably formed to a thickness of between about 10 Angstroms and 200 Angstroms.

A first conductive layer 22 is deposited overlying the gate oxide layer 18. The first conductive layer 22 will subsequently form both MOS transistor gate electrodes and the bottom plates for the sidewall capacitors. In the preferred embodiment, the first conductive layer 22 comprises polysilicon that may be either doped or undoped. The polysilicon is deposited using a low-pressure chemical vapor deposition (LPCVD) to a thickness of between about 1,000 Angstroms and 4,000 Angstroms.

Figure 3:
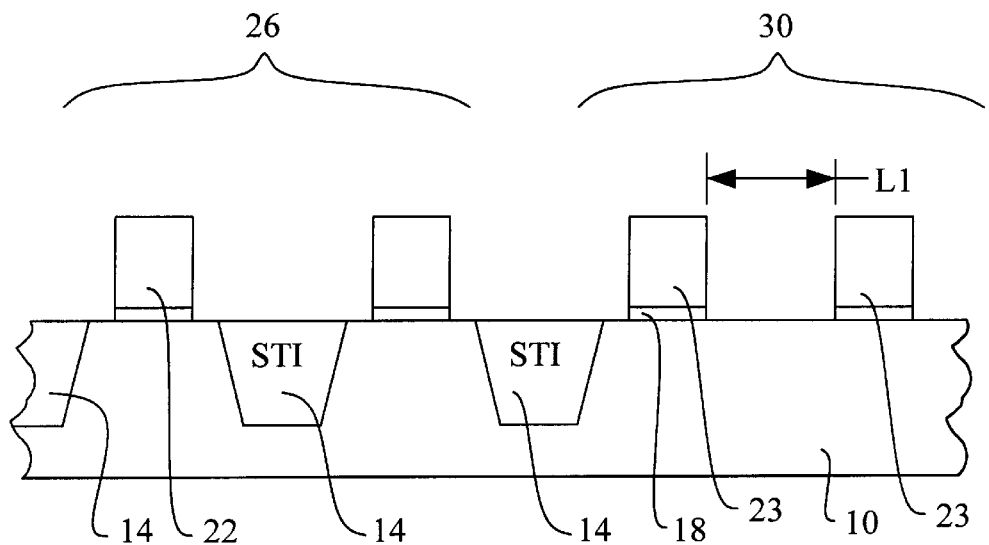

Referring now to FIG. 3, an important feature of the present invention is illustrated. The first conductive layer 22 and the gate oxide layer 18 are patterned to form conductive lines overlying the semiconductor substrate 10. The conductive lines comprise MOS transistor gates 22, formed in transistor area 26, and the bottom plates 23 for the planned sidewall capacitors in the capacitor area 30. The patterning step may be performed using a conventional process comprising a lithographic exposure and development followed by an etching step.

Figure 9:
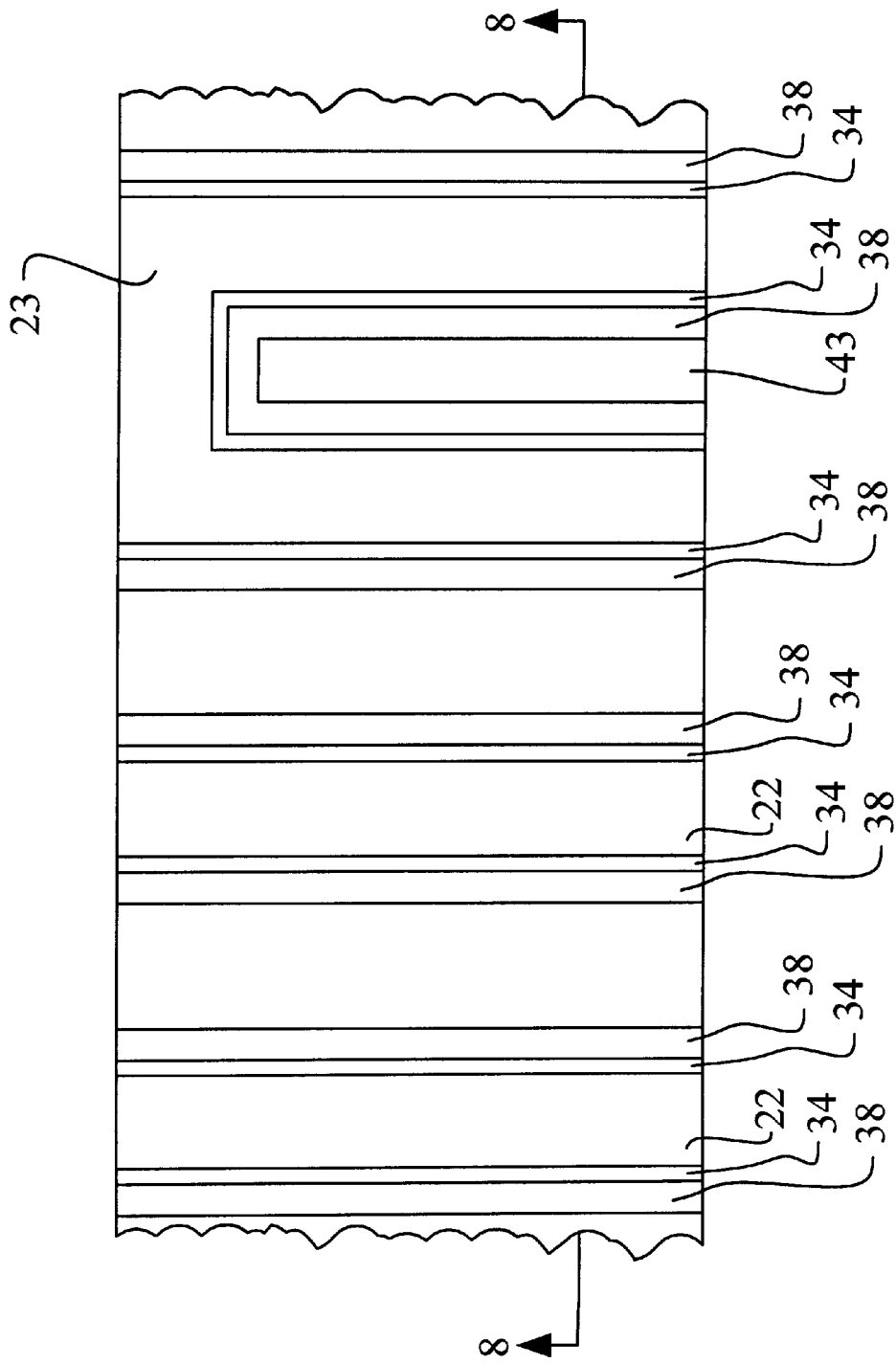
FIG. 9 schematically illustrates a top view of the preferred embodiment of the present invention.

The bottom plates 23 are formed for a single capacitor. The bottom plates 23, which are connected as shown in the top view illustration of FIG. 9, are separated by a space L1 of between about 0.2 microns and 1.0 microns.

This space L1 is sufficiently large enough to enable void-free filling of the space in subsequent layer deposition steps.

Figure 4:
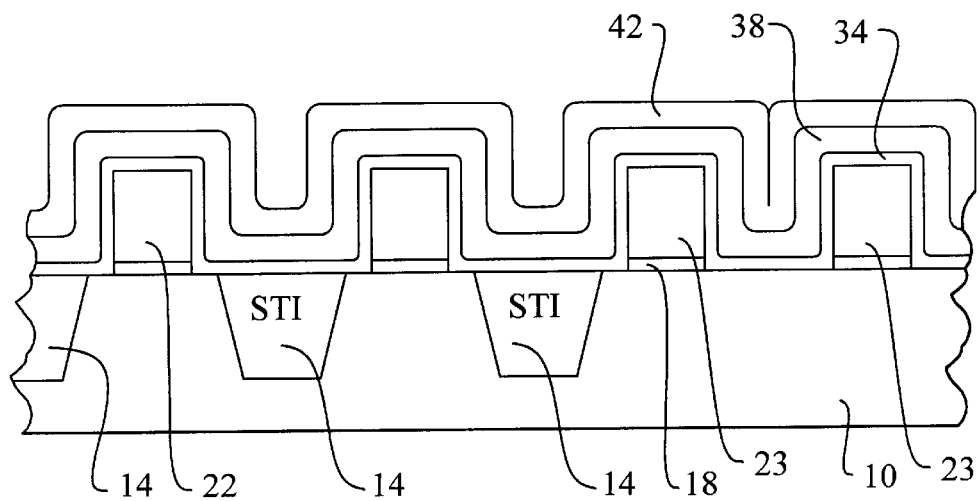

Referring now to FIG. 4, important features of the present invention are illustrated. A silicon dioxide layer 34 is deposited overlying the MOS transistor gates 22 and the bottom plates 23. The silicon dioxide layer 34 electrically isolates the MOS transistor gates 22 and the bottom plates 23 and protects them during the subsequent process steps. In addition, the silicon dioxide layer 34 forms a part of the capacitor dielectric for the sidewall capacitor of the present invention. The silicon dioxide layer 34 is deposited by a CVD process to a thickness of between about 100 Angstroms and 300 Angstroms.

A dielectric layer 38 is deposited overlying the silicon dioxide layer 34. The dielectric layer 38 preferably comprises silicon nitride. The dielectric layer 38 will form a part of the capacitor dielectric for the sidewall capacitor. In addition, the dielectric layer 38 will be subsequently etched to form the sidewall spacers for the MOS transistor gates 22. The combined thickness of the silicon dioxide layer 34 and the dielectric layer 38 will form the overall capacitor dielectric. The dielectric layer 38 preferably comprises silicon nitride deposited by LPCVD to a thickness of between about 100 Angstroms and 1,000 Angstroms.

A second conductive layer 42 is deposited overlying the dielectric layer 38. The second conductive layer 42 will form the top plate for the completed capacitors. The second conductive layer 42 preferably comprises polysilicon that may be either doped or undoped. The polysilicon of the second conductive layer 42 is preferably deposited by LPCVD to a thickness of between about 200 Angstroms and 2,000 Angstroms. Preferably, the narrow spacing of the bottom plates 23 will cause the deposited second conductive layer 42 to completely fill the space as shown.

Figure 5:
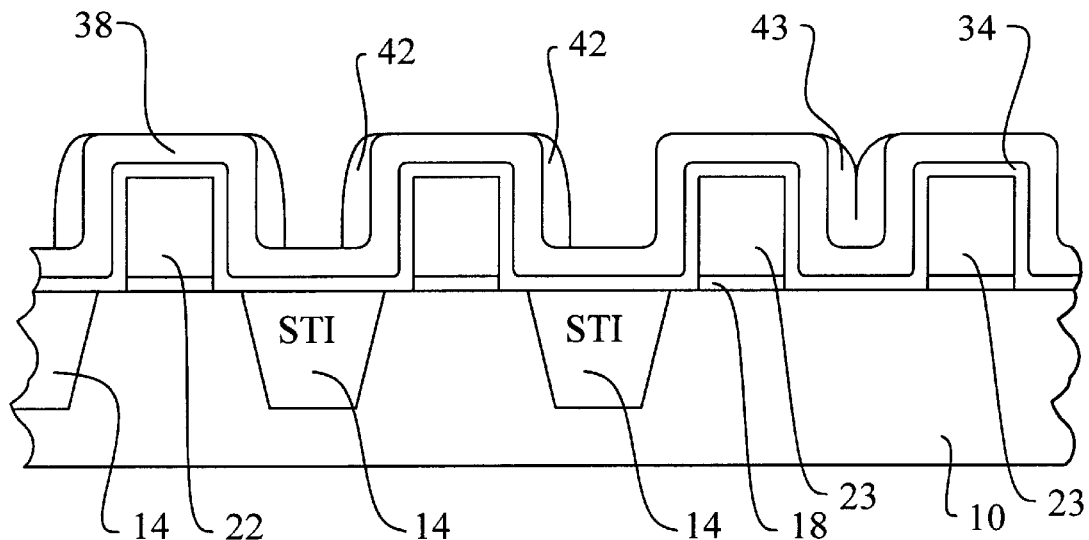

Referring now to FIG. 5, another important feature of the present invention is illustrated. The second conductive layer 42 is etched down to form conductive sidewall spacers 42 on the dielectric layer 38 of the MOS transistor gates 22. This etching down also forms the top plate 43 for the sidewall capacitor. The etching down step is an anisotropic etch where the second conductive layer 42 is removed much more rapidly in the vertical direction than in the horizontal. The preferred etching process comprises a dry etch using a chemistry of, for example, HBr or $Cl_2$. The conductive sidewall spacers 42 formed on the MOS transistor gates 22 are temporary and will be removed in the next step. Note that the etch down step does not separate the top plate 43 into two sidewalls. At this point in the process, the capacitor has been completed excepting connectivity to an overlying metal layer.

Figure 6:
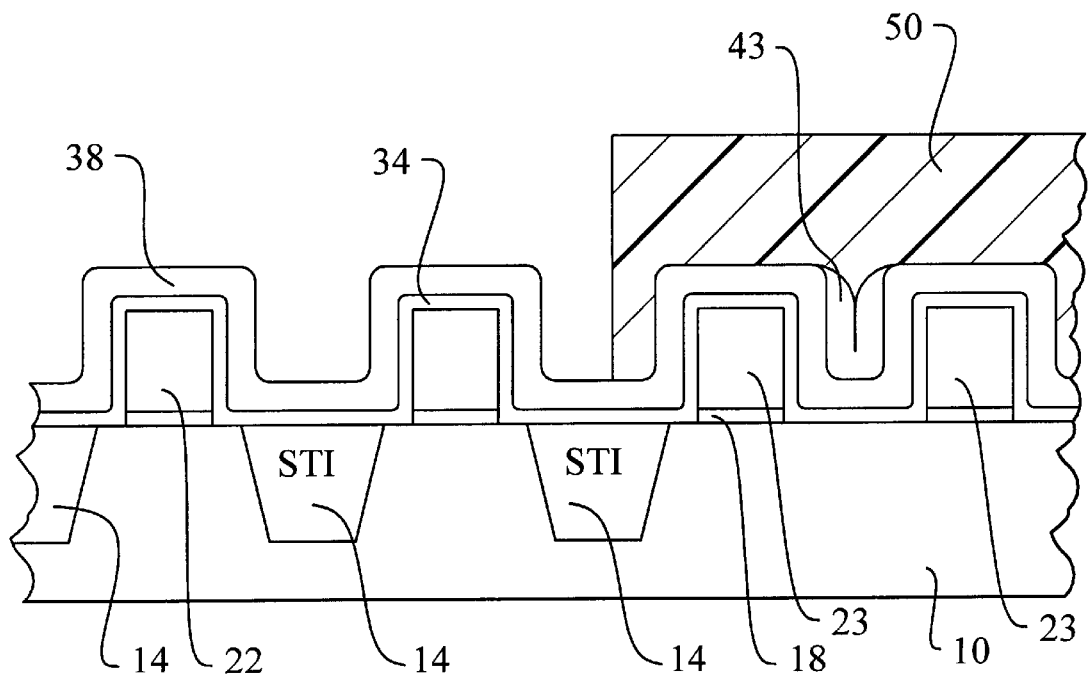

Referring now to FIG. 6, another important step in the method of the present invention is shown. The conductive sidewall spacers 42 of the MOS transistor gates 38 are etched away. A protective mask 50 protects the top plates 43 of the sidewall capacitors from the etching step. The etching process preferably comprises a dry etch using an etching chemistry of, for example, HBr or $Cl_2$. The protective mask 50 may comprise photoresist that has been exposed and developed.

Figure 7:
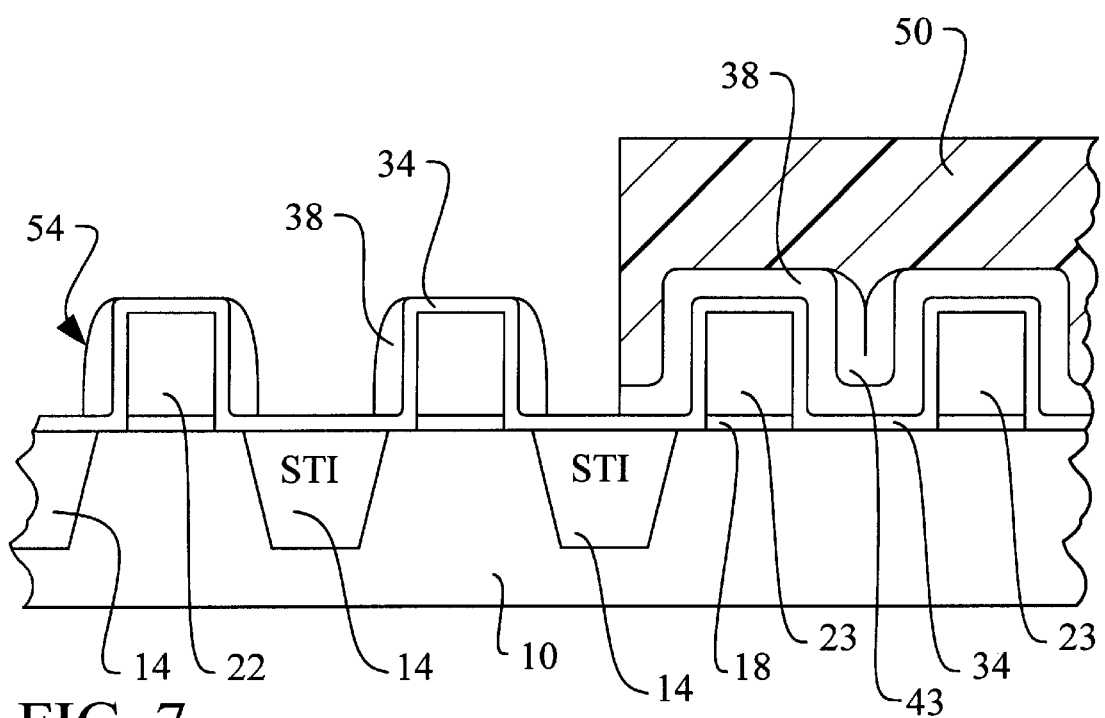

Referring now to FIG. 7, another important feature of the present invention is shown. The dielectric layer 38 is etched down to form dielectric sidewall spacers 38 on the MOS transistor gates 22. The protective mask 50 again protects the capacitor area from the etching process. The etching down process preferably comprises a dry etch using a carbon and fluorine containing compound such as $CF_4$.

Figure 8:
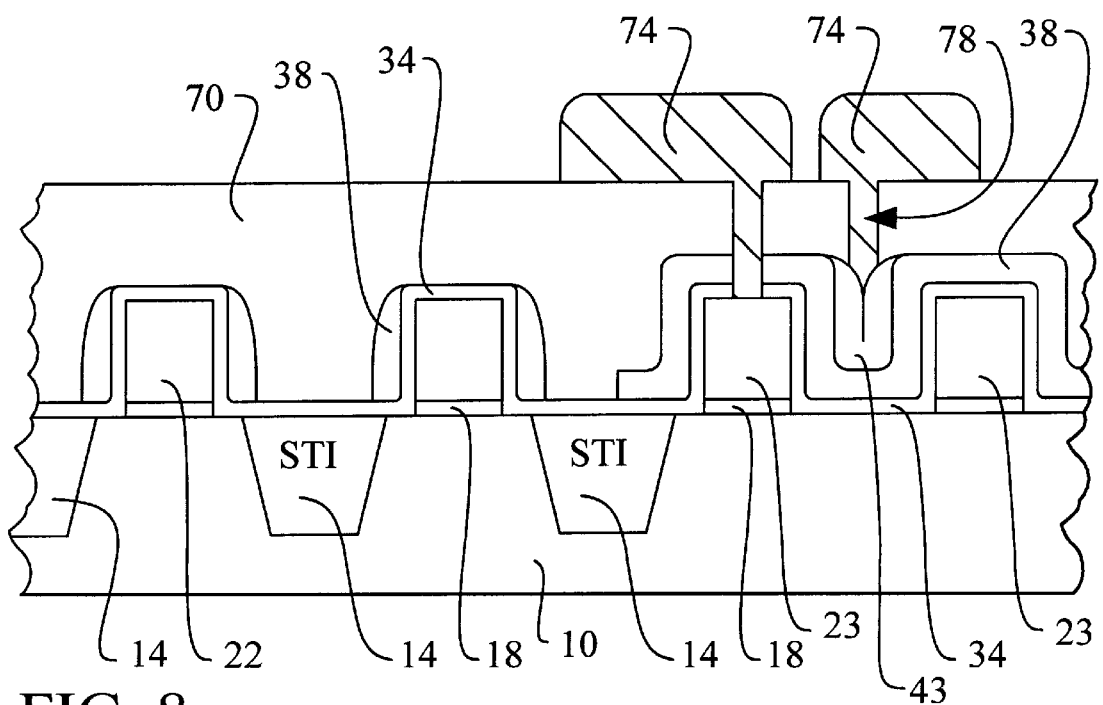

Referring now to FIG. 8, the sidewall capacitor is completed as illustrated. An interlevel dielectric layer (ILD) 70 is deposited overlying the MOS transistor gates and the sidewall capacitor. Contact openings are etched through the interlevel dielectric layer 70. Note especially the contact opening 78 for the top plate 43 of the sidewall capacitor. Careful alignment of the contact mask must be made to create this contact opening 78. A metal layer 74 is deposited overlying the interlevel dielectric layer 70 and filling the contact openings. The metal layer 74 is patterned to form separate connective lines.

Referring now to FIG. 9, a top view of the conductive lines 22, 23, 43 of the view 8—8 of the preferred embodiment of the present invention is shown before metal layer 74 is deposited and patterned. The MOS transistor gates 22 are shown. Note that the bottom plate 23 of the sidewall capacitor runs parallel to the top plate 43. The small distance between the top plate 43 and the bottom plate 23 comprises the silicon dioxide layer 34 and the dielectric layer 38 as shown in FIG. 8. Because the top plate 43 and the bottom plate 23 are separated by a small distance by high dielectric constant materials, the sidewall capacitor exhibits a large unit area capacitance.

The specific advantages of the present invention can now be listed. First, the novel process creates a sidewall capacitor of large unit capacitance. Second, the process enables the creation of the capacitors alongside MOS transistors. Third, the process enables the creation of polysilicon parallel plate capacitors.

As shown in the preferred embodiments, the present invention provides a very manufacturable process for forming sidewall capacitors in an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form sidewall capacitors while forming MOS transistor gates in the manufacture of an integrated circuit device comprising:

forming conductive lines overlying a semiconductor substrate wherein some of said conductive lines form the bottom plates for said sidewall capacitors and wherein others of said conductive lines form said MOS transistor gates;

depositing a silicon dioxide layer overlying said conductive lines;

depositing a dielectric layer overlying said silicon dioxide layer;

depositing a conductive layer overlying said dielectric layer;

etching down said conductive layer to form conductive sidewall spacers on said dielectric layer of said MOS transistor gates and to form the top plates between each two of said bottom plates for said sidewall capacitors; and etching away said conductive sidewall spacers while protecting said top plate with a protective mask to complete formation of said sidewall capacitors while forming said MOS transistor gates in the manufacture of said integrated circuit device.

2. The method according to claim 1 wherein said conductive lines comprise polysilicon.

3. The method according to claim 1 wherein said conductive lines are spaced between about 0.2 microns and 1.0 microns.

4. The method according to claim 1 wherein said silicon dioxide layer is deposited to a thickness of between about 100 Angstroms and 300 Angstroms.

5. The method according to claim 1 wherein said dielectric layer comprises silicon nitride.

6. The method according to claim 1 wherein said conductive layer comprises polysilicon.

7. The method according to claim 1 wherein said step of etching down said conductive layer is by a dry etch comprising one of the group of: HBr and $Cl_2$.

8. A method to form sidewall capacitors while forming MOS transistor gates in the manufacture of an integrated circuit device comprising:

forming conductive lines overlying a semiconductor substrate wherein some of said conductive lines form the bottom plates for said sidewall capacitors and wherein others of said conductive lines form MOS transistor gates;

depositing a silicon dioxide layer overlying said conductive lines;

depositing a dielectric layer overlying said silicon dioxide layer;

depositing a conductive layer overlying said dielectric layer;

etching down said conductive layer to form conductive sidewall spacers on said dielectric layer of said MOS transistor gates and to form a top plate between each two of said bottom plates to complete said sidewall capacitors;

etching away said conductive sidewall spacers while protecting said top plate with a protective mask; and etching down said dielectric layer to form dielectric sidewall spacers on said MOS transistor gates while protecting said sidewall capacitors with a protective mask to complete said sidewall capacitors and said MOS transistor gates in the manufacture of said integrated circuit device.

9. The method according to claim 8 wherein said conductive lines comprise polysilicon.

10. The method according to claim 8 wherein said conductive lines are spaced between about 0.2 microns and 1.0 microns.

11. The method according to claim 8 wherein said silicon dioxide layer is deposited to a thickness of between about 100 Angstroms and 300 Angstroms.

12. The method according to claim 8 wherein said dielectric layer comprises silicon nitride.

13. The method according to claim 8 wherein said conductive layer comprises polysilicon.

14. The method according to claim 8 wherein said conductive layer is deposited to a thickness of between about 200 Angstroms and 2,000 Angstroms.

15. The method according to claim 8 wherein said step of etching down said conductive layer is by a dry etch comprising one of the group of: HBr and $Cl_2$.

16. A method to form sidewall capacitors while forming MOS transistor gates in the manufacture of an integrated circuit device comprising:

forming polysilicon lines overlying a semiconductor substrate wherein some of said conductive lines form the bottom plates for said sidewall capacitors and wherein others of said conductive lines form MOS transistor gates;

depositing a silicon dioxide layer overlying said polysilicon lines;

depositing a silicon nitride layer overlying said silicon dioxide layer;

depositing a polysilicon layer overlying said silicon nitride layer;

etching down said polysilicon layer to form polysilicon sidewall spacers on said silicon nitride layer of said MOS transistor gates and to form a top plate between each two of said bottom plates to complete said sidewall capacitors;

etching away said polysilcon sidewall spacers while protecting said top plate with a protective mask; and etching down said silicon nitride layer to form silicon nitride sidewall spacers on said MOS transistor gates while protecting said sidewall capacitors with a protective mask to complete said sidewall capacitors and said MOS transistor gates in the manufacture of said integrated circuit device.

17. The method according to claim 16 wherein said polysilicon lines are spaced between about 0.2 microns and 1.0 microns.

18. The method according to claim 16 wherein said silicon nitride layer is deposited to a thickness of between about 100 Angstroms and 1,000 Angstroms.

19. The method according to claim 16 wherein said polysilicon layer is deposited to a thickness of between about 200 Angstroms and 2,000 Angstroms.

20. The method according to claim 16 wherein said step of etching down said polysilicon layer is by a dry etch comprising one of the group of: HBr and $Cl_2$.

* * * * *